(12) United States Patent
Kaneko et al.

(10) Patent No.: US 6,275,684 B1
(45) Date of Patent: Aug. 14, 2001

(54) ALC CIRCUIT FOR A TRANSMITTER DEVICE

(75) Inventors: Tomoya Kaneko; Makoto Akaishi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/291,997

(22) Filed: Apr. 15, 1999

(30) Foreign Application Priority Data

Apr. 30, 1998 (JP) .................................................. 10-120589

(51) Int. Cl.[7] ...................................................... H03G 3/20
(52) U.S. Cl. .......................... 455/118; 455/115; 455/126; 330/129
(58) Field of Search ............................ 455/91, 115, 116, 455/117–118, 126, 127; 330/129, 278, 290, 291, 292, 293, 279, 229, 140, 259

(56) References Cited

U.S. PATENT DOCUMENTS

| | | | |
|---|---|---|---|
| 4,972,512 | * 11/1990 | Garskamp | 455/341 |
| 5,043,672 | 8/1991 | Youn . | |
| 5,182,527 | * 1/1993 | Nakanishi et al. | 330/285 |
| 5,298,811 | * 3/1994 | Gilbert | 307/492 |
| 5,383,223 | * 1/1995 | Inokuchi | 375/60 |
| 5,557,640 | * 9/1996 | Chadwick | 375/229 |
| 5,656,929 | * 8/1997 | Humpherys | 324/95 |
| 5,796,309 | * 8/1998 | Nguyen | 330/289 |
| 6,002,122 | * 12/1999 | Wolf | 250/207 |
| 6,020,787 | * 2/2000 | Kim et al. | 330/279 |
| 6,121,834 | * 9/2000 | Kim | 330/129 |

FOREIGN PATENT DOCUMENTS

| | | |
|---|---|---|
| 61210727 | 9/1986 | (JP) . |
| 4-157927 | 5/1992 | (JP) . |
| 4196622 | 7/1992 | (JP) . |
| 10051252 | 2/1998 | (JP) . |

* cited by examiner

Primary Examiner—Daniel Hunter
Assistant Examiner—Pablo N Tran
(74) Attorney, Agent, or Firm—Young & Thompson

(57) ABSTRACT

An object of the present invention is to provide an ALC circuit for a transmitter device and its method which are capable of obtaining a detected voltage of sufficient and stable voltage over a wide high-frequency output power range. A signal extracted from a part of a transmission output signal by a directive coupler and a signal obtained by branching and amplifying a part of a local oscillation signal which is inputted to a first mixer for an up-convertor are inputted as a local oscillation signal of a second mixer. After the local oscillation signal has been down-converted into an intermediate frequency signal, it is inputted to a logarithmic amplifier through a band pass filter. The output signal of the logarithmic amplifier is extracted as a detected signal through a diode detector and amplified by a differential amplifier. The variable attenuator is controlled according to the amplified output to obtain a transmission output power.

5 Claims, 4 Drawing Sheets

ALC CIRCUIT FOR A TRANSMITTER DEVICE

BACKGROUND OF THE INVENTION

1. Field of the Invention

The present invention relates to a microwave/millimeter wave transmitter device having a frequency up convertor, and more particularly to an ALC (automatic level control) circuit for stabilizing the output level of the transmitter device.

2. Description of the Related Art

The structure of a conventional transmitter device having an ALC function (Japanese Patent Application Laid-open No. Hei 4-157927) is shown in FIG. 5. An inputted intermediate frequency signal (IF signal) is mixed with the output of a local oscillator 20 by a mixer 21 so as to be converted into a radio frequency signal (RF signal), and then amplified by a variable gain amplifier 22 and a power amplifier 23, thus being outputted as an RF signal. The RF signal transmission output level is detected by a detector 24, and then sent to the variable gain amplifier 22 through an automatic gain control circuit (AGC) 25, where the gain of the variable gain amplifier 22 is controlled to make the RF signal transmission output level constant.

However, the above-described transmitter device is expensive because the variable gain amplifier 22 of an RF-band is employed. Also, because automatic gain control is conducted after frequency conversion, in the transmitter device that alters the transmission frequency by use of the local oscillator of the synthesizer system, the variable gain amplifier 22 is required to provide an excellent frequency characteristic in a wide band within the limit of all the gain variations. In addition, when the IF input is interrupted, the variable gain amplifier 22 has the maximum gain, and the leakage of the local signal from the mixer 21 is greatly amplified, resulting in such a problem that the spurious characteristic of the RF output is deteriorated.

In view of the above, a transmitter device shown in FIG. 6 has been known as an improvement in the above-described conventional transmitter device. This transmitter device inputs an IF input signal to a variable gain amplifier 30 to conduct a predetermined amplification, and mixes it by a mixer 32 with the output of a local oscillator 31 to convert it into an RF signal. Then, the transmitter device amplifies the RF signal thus converted is amplified by a power amplifier 33 to extract a transmission output.

In the above transmitter device, the output of the power amplifier 33 is partially branched and detected by a detector 34 to detect an RF transmission output level. The automatic gain control circuit 35 controls the gain of the variable gain amplifier 30 so that the detection output of the detector 34 becomes a predetermined value, to thereby make the RF transmission output level constant.

Accordingly, the above transmitter device per se can be manufactured inexpensively as compared with the above-described conventional transmitter device. Also, because the automatic gain control is conducted before frequency conversion, the variable gain amplifier 30 can control the gain of the IF signal having a predetermined center frequency. As a result, the variable gain amplifier 30 does not particularly require an excellent frequency characteristic in a wide band. Also, there is advantageous in that when the IF signal input is interrupted, the variable gain amplifier 30 becomes the maximum gain so that there is no case in which the leakage of the local signal from the mixer 32 is greatly amplified, thereby being capable of preventing the spurious characteristic of the RF output from being deteriorated. However, in the above-described two conventional transmitter devices, the signal branched from the output of the power amplifier is detected directly by a diode.

Since the input power to detected voltage characteristic of the general diode is that the forward voltage of the diode increases at a low temperature as shown in FIG. 4, the detected voltage is decreased at a reduced input power. Also, there is a risk that the diode is broken when the input power is inputted at the maximum input or more which is determined by a reverse withstand voltage of the diode junction.

For that reason, a range in which a given detected voltage is stably obtained even if an environmental temperature is varied is very narrow to the degree of about 20 dB (100 times) at most.

With the application of a circuit structure in which the output power can be made constantly a predetermined value by use of an automatic level control circuit (ALC) where a part of the output power of the transmitter device is branched and detected as a power monitor, and then compared with a reference voltage to control a variable attenuator, the reference voltage is varied so that the output power of the transmitter device can be varied. However, a variable range in which the varied output power level can be made constant with respect to the environmental temperature is about 20 dB at most because of the limited characteristic of the above diode, and in the case where the output power is controlled and varied, it is very difficult to obtain the detected voltage of sufficient and stable voltage over a wide high-frequency output power range.

SUMMARY OF THE INVENTION

The present invention has been made to solve the above drawbacks with the prior art, and therefore an object of the present invention is to provide an ALC circuit for a transmitter device in which a logarithmic amplifier is applied at a prestage of a detector, a power obtained by branching a part of transmission output through a directional coupler is down-converted to an intermediate frequency (for example, 1 GHz or less) once so as to be converted into a frequency at which the logarithmic amplifier is operable. With this structure, even if a change in power level is the degree of several decades (for example, 1000 times), a change in the output power level of the logarithmic amplifier can be made several times (for example, 3 times) as much as the original output power level, and a change of the power of several times can be detected in a range in which linearity of the detection diode is excellent (−10 to 10 dBm, 100 times in FIG. 4). Then, even in the case where a differential amplifier reference voltage is varied to control and vary the output power, the detected voltage of the sufficient and stable voltage can be obtained over a wide high-frequency output power range.

In order to solve the above problems, according to the present invention, there is provided an ALC circuit for a transmitter device having a frequency up-convertor of microwaves and millimeter waves, a variable attenuator and a power amplifier which comprises: a first mixer that inputs an oscillation signal of a local oscillator; a second mixer that inputs a part of the oscillation signal of the local oscillator and a part of a transmission output signal amplified up to a predetermined level by the power amplifier to output a down-converted intermediate frequency signal; a logarithmic amplifier that amplifies the intermediate frequency signal outputted by the second mixer to a predetermined level; a detector that obtains a level monitor voltage proportional to the logarithm of a signal level outputted by the logarithmic amplifier; and a differential amplifier that compares the output signal of the detector with a DC reference voltage that determines the transmission output power to amplify the comparison result; wherein the output of the differential amplifier is inputted to the variable attenuator to control the transmission output signal.

BRIEF DESCRIPTION OF THE DRAWINGS

These and other objects, features and advantages of this invention will become more fully apparent from the following detailed description taken with the accompanying drawings in which.

DETAILED DESCRIPTION OF THE PREFERRED EMBODIMENTS

Now, a description will be given in more detail of preferred embodiments of the present invention with reference to the accompanying drawings.

Figure 1:
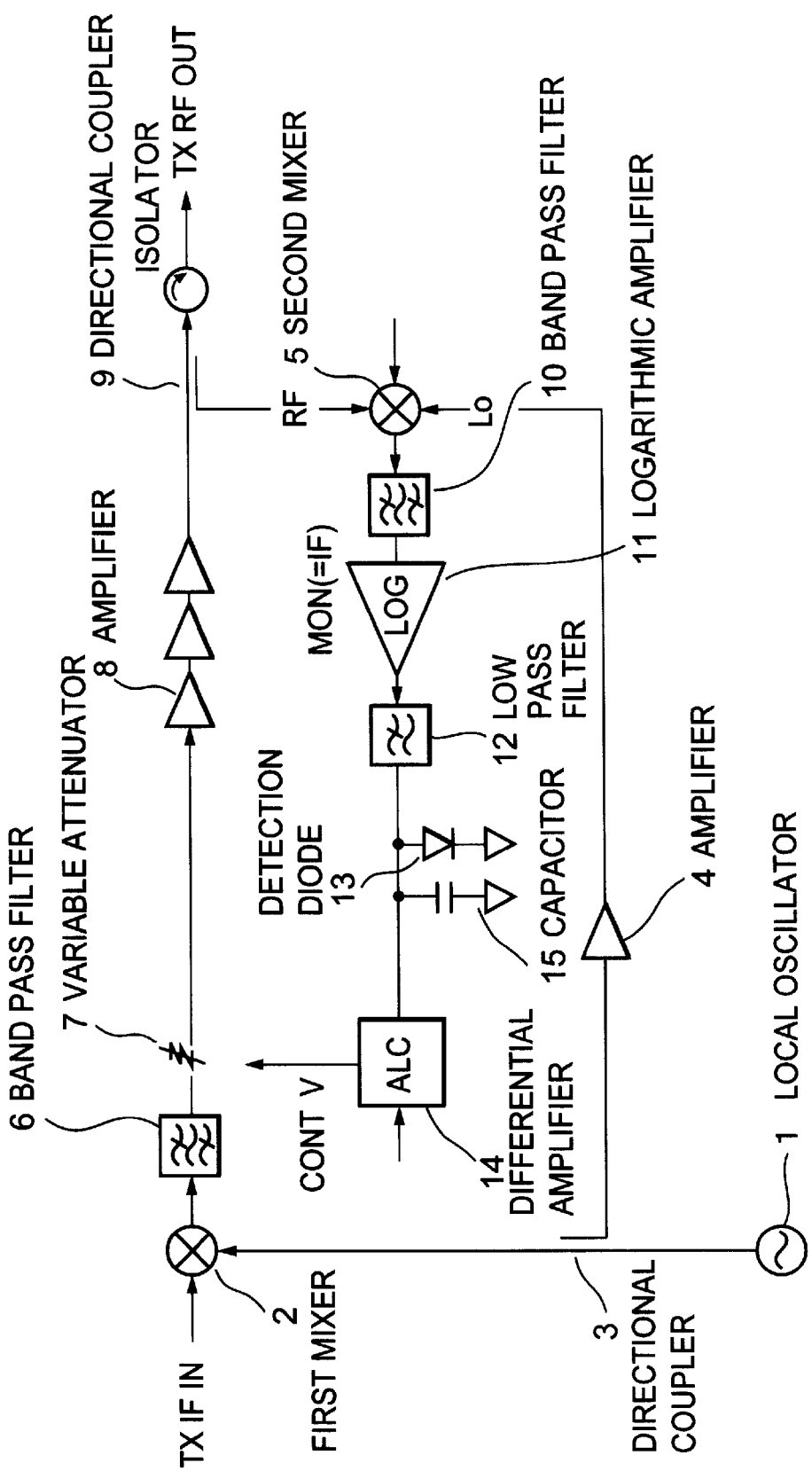
FIG. 1 is a circuit diagram showing an ALC circuit for a microwave/millimeter wave communication transmitter device in accordance with the present invention.

In FIG. 1, reference numeral 1 denotes a local oscillator an oscillation output of which is inputted to a first mixer 2. A part of the oscillation output of the local oscillator 1 is branched by a directional coupler 3 and then inputted as a local oscillation signal to a second mixer 5 through an amplifier 4.

Figure 2:
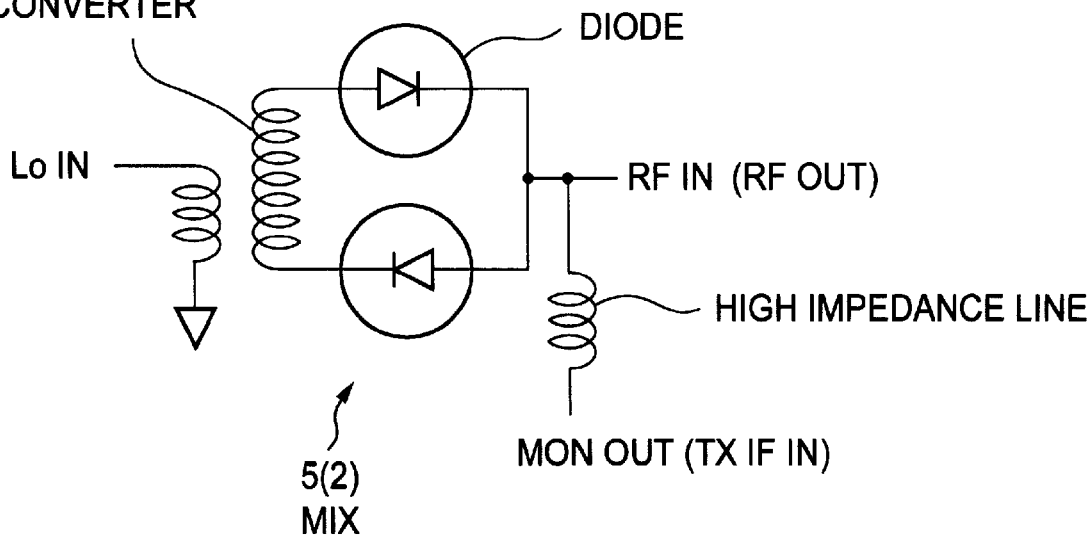
FIG. 2 is an equivalent circuit diagram showing a balance mixer used for first and second mixers in accordance with an embodiment of the present invention.
Figure 3:
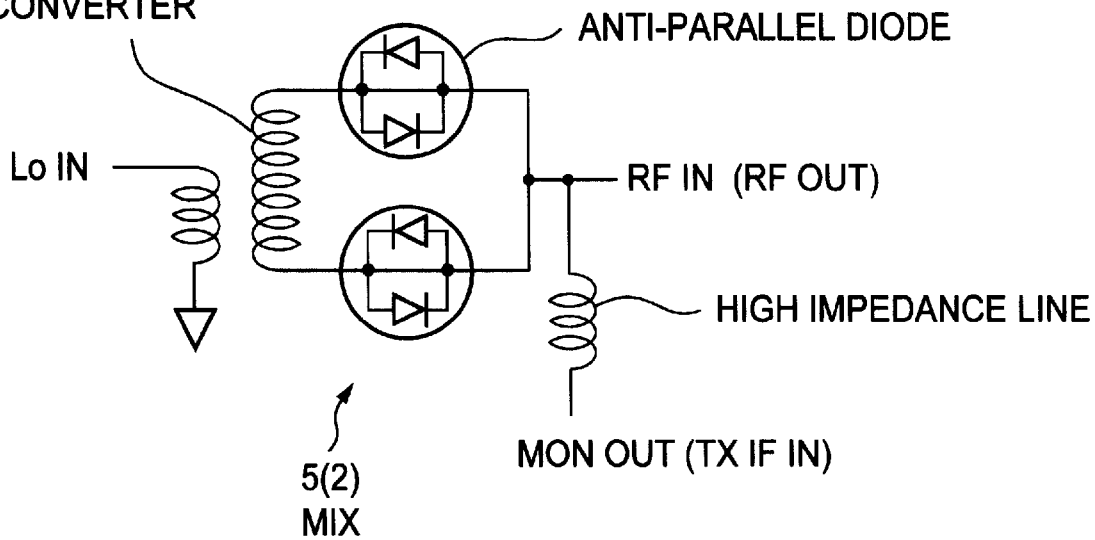
FIG. 3 is an equivalent circuit diagram showing a balance mixer used for the first and second mixers in accordance with another embodiment of the present invention.

The first mixer 2 and the second mixer 5 are made up of a diode, respectively, and both the mixers 2 and 5 are formed of a ballance mixer using the diode, respectively, as shown in FIGS. 2 and 3.

The application of the above structure prevents a signal obtained by up-converting the local oscillation signal that is inputted to the first mixer 2 from being leaked from the output terminal, and a signal obtained by down-converting the local oscillation signal in the second mixer 5 from being leaked from the output terminal.

Also, an intermediate frequency signal is inputted to the first mixer 2 and then up-converted to the transmission frequency signal of microwaves and millimeter waves. The output signal thus up-converted passes through a band pass filter 6, to thereby suppress the local oscillation signal and an image signal. Then, a signal outputted from the band pass filter 6 is amplified up to a predetermined level by a variable attenuator 7 and a power amplifier 8, and then extracted as a transmission output signal.

The power amplifier 8 is formed of MES FET using compound semiconductor or a monolithic integrated circuit having a matching circuit on its semiconductor chip.

A part of the output signal outputted from the power amplifier 8 is branched by a directive coupler 9 and then inputted to the above-described second mixer 5. Then, the signal is extracted by the second mixer 5 as an intermediate frequency signal of a level proportional to the amplified output signal level of the power amplifier 8. The intermediate frequency signal extracted from the second mixer 5 is sent to a band pass filter 10, and after an unnecessary wave is suppressed by the band pass filter 10, the intermediate frequency signal is inputted to a logarithmic amplifier 11. The signal extracted from the logarithmic amplifier 11 is inputted to a detection diode 13 through a low pass filter 12. Then, a level monitor voltage proportional to the logarithm of the transmission output signal level is obtained through the detection processing.

The level monitor voltage obtained in the above manner is inputted to a differential amplifier 14 at a succeeding stage, the differential amplifier 14 compares the inputted voltage with a DC reference voltage that determines a transmission output power and amplifies the comparison result to output the same as a DC voltage that controls the above-described variable attenuator 7.

The detection diode 13 is connected in parallel with a capacitor 15 that suppresses a modulated component contained in the transmission wave.

Since a transmitter device for the microwave/millimeter wave communication according to the present invention is structured as described above, even if the output power increases because of the fluctuation of an amplifier gain or the fluctuation of the intermediate frequency input power due to a change in temperature, the detected voltage rises so that the quantity of attenuation of the variable attenuator also increases. Conversely, when the output power reduces, since the differential amplifier 14 functions in such a manner that the detected voltage drops so that the quantity of attenuation of the variable amplifier also decreases, the actual output level is always constantly controlled even if a change in temperature or the input level fluctuation occurs.

The differential amplifier 14 can appropriately change the output power of the amplifier by altering the reference voltage inputted from the external.

According to the present invention, since the logarithmic amplifier 11 is applied so that the power branched from the output of the transmitter device is once down-converted to the intermediate frequency (for example, 1 GHz or less) which is a frequency at which the logarithmic amplifier 11 is operable, a change in the output power level of the logarithmic amplifier 11 can be restrained to several times (for example, three times) as much as the original output power level even if a change in the power level increases to several decades (for example, 1000 times), thus the present invention being capable of setting a range in which linearity of the detection diode 13 is excellent.

Also, in the case where the reference voltage of the differential amplifier 14 is made variable to control and change the output power, the detected voltage of the sufficient and stable voltage can be obtained over a wide high-frequency output power range.

In the case of the transmitter device using an even higher harmonic mixer for the first mixer 2 (up-convertor), if an even higher harmonic mixer is used also for the second mixer 5 (down-convertor), the same effect can be obtained.

According to the present invention, as was described above, a receiver input power in an actual running state of the transmitter device has a difference of 10E6 to 10E7 times (60 dB to 70 dB) between the maximum and the minimum.

In order to detect the wide range level, after the level is logarithmically converted by the logarithmic amplifier, the level is detected by the diode.

Figure 4:
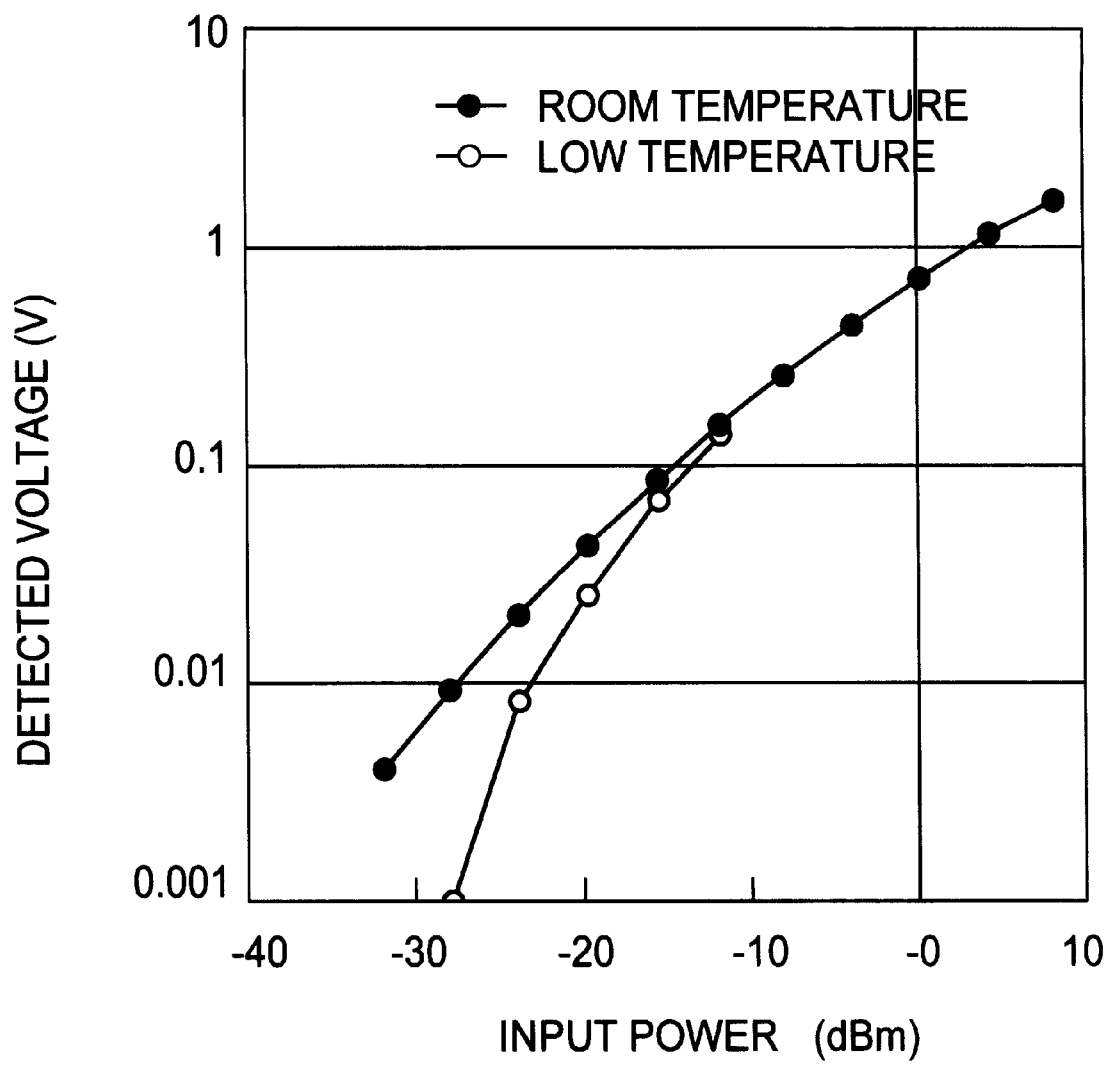
FIG. 4 is a graph representing the detection characteristic of a diode.

The detection characteristic of a normal detection diode where a rectified voltage is obtained by inputting the high frequency input directly to the diode is, as shown in FIG. 4, that a range in which the detected output voltage excellent in linearity with respect to the input power in a wide temperature range (for example, −30 to 70° C.) is 20 dB at most. This is because the upper limit of the power inputted to the diode is determined by the joint reverse withstand voltage of the diode.

Also, at a low temperature, the detected voltage at the time of the low input power is reduced because the forward voltage absolute value of the diode increases (This is indicated by a rhomboid in FIG. 4. The detected voltage is rapidly reduced at the time of −15 dBm or less as compared with that at the room temperature as indicated by a square). At an actual environmental temperature at which the transmitter device is used, or less, for the purpose of monitoring the output power of the transmitter device, the input power range more than the above range is required.

Figure 5:
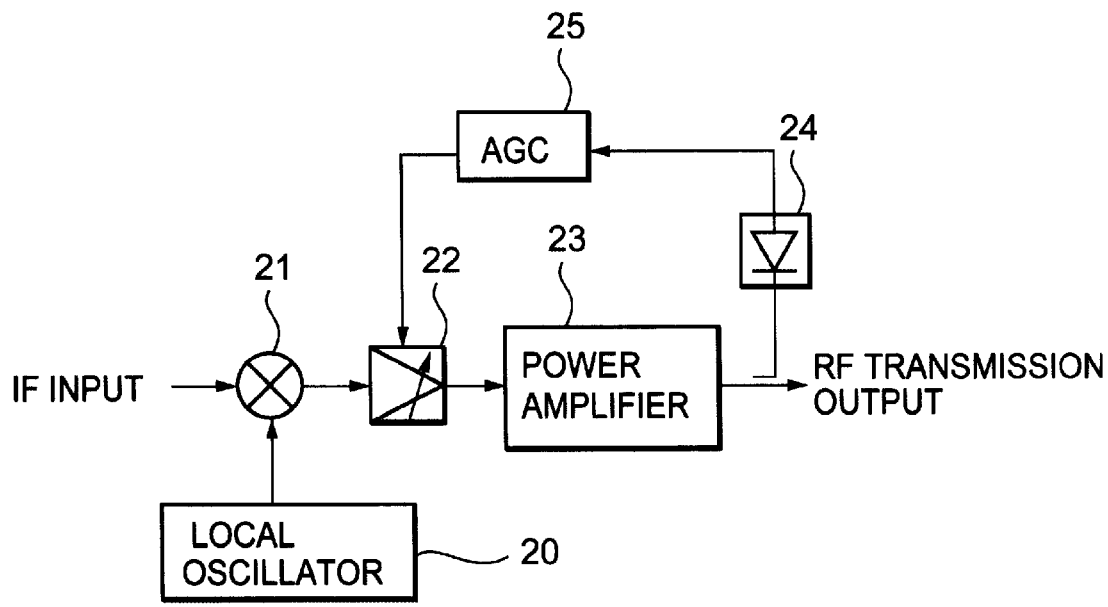
FIG. 5 is a circuit diagram showing a conventional ALC circuit for a microwave/millimeter wave communication transmitter device.
Figure 6:
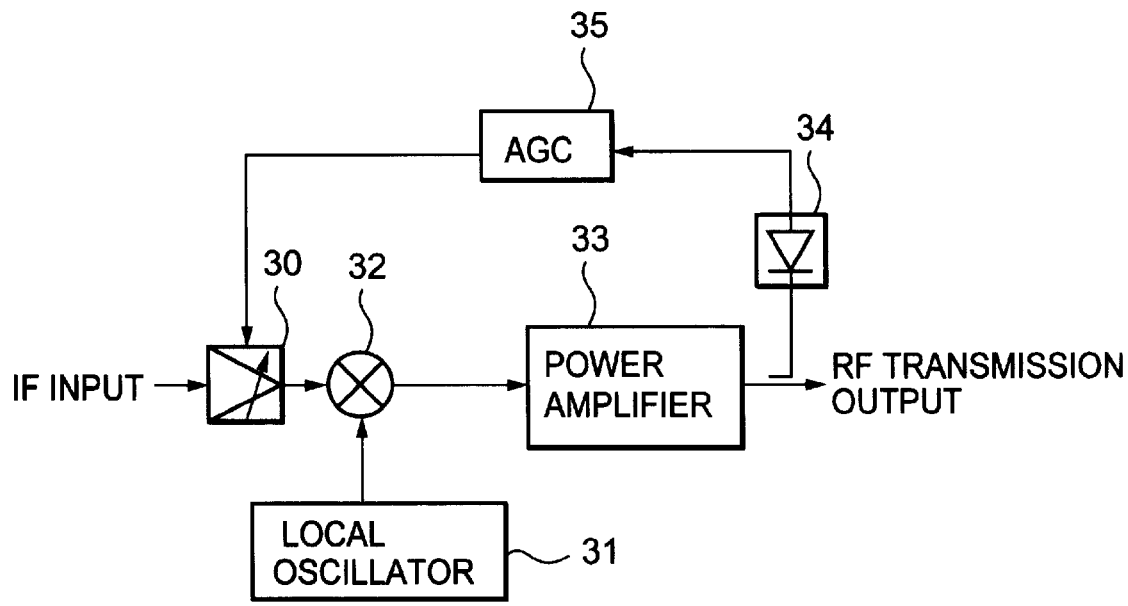
FIG. 6 is a circuit diagram showing another conventional ALC circuit for a microwave/millimeter wave communication transmitter device.

According to the present invention, in order to use the logarithmic amplifier, since the power branched from the output of the transmitter device is once down-converted to the intermediate frequency (for example, 1 GHz or less) which is a frequency at which the logarithmic amplifier is operable, a change in the output power level of the logarithmic amplifier can be restrained to several times (for example, three times) as much as the original output power level even if a change in the power level increases to several decades (for example, 1000 times). As a result, a change in the power of several times can be set at a range in which linearity of the detection diode is excellent (−10 to 10 dBm, 100 times in the case of FIG. 5), and the adjustment is readily made by designing and adjusting the degree of coupling of the directive coupler that branches the output power of the amplifier.

In addition, in the case where the output power is controlled and changed by varying the reference voltage which is inputted to the differential amplifier, the detected voltage of the sufficient and stable voltage can be obtained over a wide high-frequency output power range. For that reason, the present invention has such various excellent advantages that in the microwave/millimeter wave transmitter device, the control of the output level of the transmitter device can be particularly readily made, and the device can be structured by a simple circuit.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An ALC circuit for a transmitter device having a frequency up-convertor of microwaves and millimeter waves, a variable attenuator and a power amplifier which comprises:

a first mixer that inputs an oscillation signal of a local oscillator;

a second mixer that inputs a part of the oscillation signal of said local oscillator and a part of a transmission output signal amplified up to a predetermined level by said power amplifier to output a down-converted intermediate frequency signal;

a logarithmic amplifier that amplifies the intermediate frequency signal outputted by said second mixer to a predetermined level;

a detector that obtains a level monitor voltage proportional to the logarithm of a signal level outputted by said logarithmic amplifier;

a differential amplifier that compares the output signal of said detector with a DC reference voltage that determines the transmission output power to amplify the comparison result; and said variable attenuator the quantity of attenuation is controlled according to the output of said differential amplifier.

2. An ALC circuit for a transmitter device as claimed in claim 1, wherein said detector comprises a diode for obtaining a level monitor voltage according to a signal outputted through a band pass filter and said logarithmic amplifier after the signal has been down-converted to an intermediate frequency signal by said second mixer.

3. An ALC circuit for a transmitter device as claimed in claim 1, wherein said variable attenuator is controlled according to a DC signal obtained by comparing and amplifying the detected voltage with the reference voltage that determines the transmission output power through said differential amplifier.

4. An ALC circuit for a transmitter device as claimed in claim 1, wherein said first mixer comprises an even higher harmonic mixer, and said second mixer comprises an even higher harmonic mixer.

5. An ALC circuit for a transmitter device as claimed in claim 1, wherein said first and second mixers comprise a ballance mixer using a diode, respectively.

* * * * *